United States Patent
Mano et al.

(10) Patent No.: US 10,388,451 B2
(45) Date of Patent: Aug. 20, 2019

(54) INDUCTOR COMPONENT AND METHOD FOR MANUFACTURING INDUCTOR COMPONENT

(71) Applicant: IBIDEN CO., LTD., Ogaki-shi (JP)

(72) Inventors: Yasuhiko Mano, Ogaki (JP); Hiroaki Kodama, Ogaki (JP); Hisashi Kato, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 24 days.

(21) Appl. No.: 15/614,919

(22) Filed: Jun. 6, 2017

(65) Prior Publication Data

US 2017/0352471 A1   Dec. 7, 2017

(30) Foreign Application Priority Data

Jun. 6, 2016  (JP) ................. 2016-112461

(51) Int. Cl.
*H01F 27/24* (2006.01)
*H01F 17/00* (2006.01)
(Continued)

(52) U.S. Cl.
CPC ..... *H01F 27/2828* (2013.01); *H01F 17/0006* (2013.01); *H01F 17/0013* (2013.01); *H01F 17/0033* (2013.01); *H01F 27/24* (2013.01); *H01F 27/324* (2013.01); *H01F 41/005* (2013.01); *H05K 1/165* (2013.01);
(Continued)

(58) Field of Classification Search
CPC ............... H01F 17/006; H01F 17/0033; H01F 17/0013; H01F 2017/002; H01F 2017/065; H01F 2017/0073; H01F 27/2828; H01F 27/24; H01F 27/324; H01F 41/005; H05K 1/165; H05K 1/18; H05K 2201/1003
USPC ....... 336/105, 200, 223, 233; 29/602.1, 605, 29/606; 361/760

See application file for complete search history.

(56) References Cited

U.S. PATENT DOCUMENTS

2011/0232948 A1* 9/2011 Sato ..................... H05K 3/4661
174/255
2011/0284277 A1* 11/2011 Kato ..................... H05K 1/113
174/258

(Continued)

FOREIGN PATENT DOCUMENTS

JP    2008-270532 A    11/2008

*Primary Examiner* — Mang Tin Bik Lian
(74) *Attorney, Agent, or Firm* — Oblon, McClelland, Maier & Neustadt, L.L.P.

(57) ABSTRACT

An inductor component includes a core base material, a magnetic body in the core, a first conductor pattern formed on primary surface of the core, a second conductor pattern formed on secondary surface of the core, and through-hole conductors formed in through holes through the core such that the conductors are connecting the first and second patterns. The first pattern, second pattern and conductors are positioned to form an inductor such that the magnetic body is positioned on inner side of the inductor, each conductor has a diameter k1, each pattern has conductor thickness in range of 50 μm to 200 μm and has line patterns each having width w1 and separated by line separation distance w2, and a ratio of cross-sectional area of each line pattern to cross-sectional area of each conductor along the diameter k1 in direction of the width w1 is in range of 0.8 to 2.0.

20 Claims, 8 Drawing Sheets

(51) Int. Cl.
*H01F 41/02* (2006.01)
*H01F 41/06* (2016.01)
*H01F 27/28* (2006.01)
*H01F 27/32* (2006.01)
*H01F 41/00* (2006.01)
*H05K 1/16* (2006.01)
*H05K 1/18* (2006.01)
H01F 17/06 (2006.01)

(52) U.S. Cl.
CPC ............... *H05K 1/18* (2013.01); *H05K 1/185* (2013.01); *H01F 2017/002* (2013.01); *H01F 2017/065* (2013.01); *H05K 2201/1003* (2013.01); *H05K 2203/1469* (2013.01)

(56) References Cited

U.S. PATENT DOCUMENTS

| | | | |
|---|---|---|---|
| 2012/0199386 A1* | 8/2012 | Adachi | H05K 3/445 174/258 |
| 2014/0159851 A1* | 6/2014 | Mano | H01F 27/2804 336/200 |
| 2015/0156880 A1* | 6/2015 | Daizo | H05K 1/183 174/251 |
| 2015/0235753 A1* | 8/2015 | Chatani | H01F 27/245 336/200 |

* cited by examiner

INDUCTOR COMPONENT AND METHOD FOR MANUFACTURING INDUCTOR COMPONENT

CROSS-REFERENCE TO RELATED APPLICATIONS

The present application is based upon and claims the benefit of priority to Japanese Patent Application No. 2016-112461, filed Jun. 6, 2016, the entire contents of which are incorporated herein by reference.

BACKGROUND OF THE INVENTION

Field of the Invention

The present invention relates to an inductor component embedded in a printed wiring board and a method for manufacturing the inductor component.

Description of Background Art

Japanese Patent Laid-Open Publication No. 2008-270532 describes an inductor component manufactured by press working. The entire contents of this publication are incorporated herein by reference.

SUMMARY OF THE INVENTION

According to one aspect of the present invention, an inductor component includes a core base material, a magnetic body accommodated in the core base material, a first conductor pattern formed on a primary surface of the core base material, a second conductor pattern formed on a secondary surface of the core base material on the opposite side with respect to the primary surface, and through-hole conductors formed in through holes formed through the core base material respectively such that the through-hole conductors are connecting the first conductor pattern and the second conductor pattern. The first conductor pattern, the second conductor pattern and the through-hole conductors are positioned to form an inductor such that the magnetic body including a magnetic material is positioned on an inner side of the inductor, the through-hole conductors is formed such that each through-hole conductor has a diameter k1, the first and second conductor patterns are formed such that each of the first and second conductor patterns has a conductor thickness in a range of 50 μm to 200 μm and has line patterns each having a width w1 and separated by a line separation distance w2, and the line patterns are formed such that a ratio of a cross-sectional area of each line pattern to a cross-sectional area of each through-hole conductor along the diameter k1 in a direction of the width w1 is in a range of 0.8 to 2.0.

According to another aspect of the present invention, a method for manufacturing an inductor component includes forming a penetrating opening through a core base material, forming a magnetic body in the penetrating opening of the core base material, forming resin insulating layers on a primary surface and a secondary surface of the core base material respectively such that the resin insulating layers cover the magnetic body in the penetrating opening of the core base material, forming penetrating holes in the core base material such that the penetrating holes penetrate through the core base material between the primary and secondary surfaces of the core base material, forming resist patterns on the resin insulating layers, applying electrolytic plating such that through-hole conductors are formed in the penetrating holes of the core base material respectively and that first electrolytic copper plating films are formed in patterns formed by the resist patterns on the resin insulating layers respectively, removing the resist patterns from the resin insulating layers, forming coverlays laminated on the resin insulating layers and first electrolytic copper plating films respectively, irradiating laser upon the coverlays such that trench grooves are formed through the coverlays and that the trench grooves expose the first electrolytic copper plating films respectively, and forming second electrolytic copper films filling the trench grooves.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
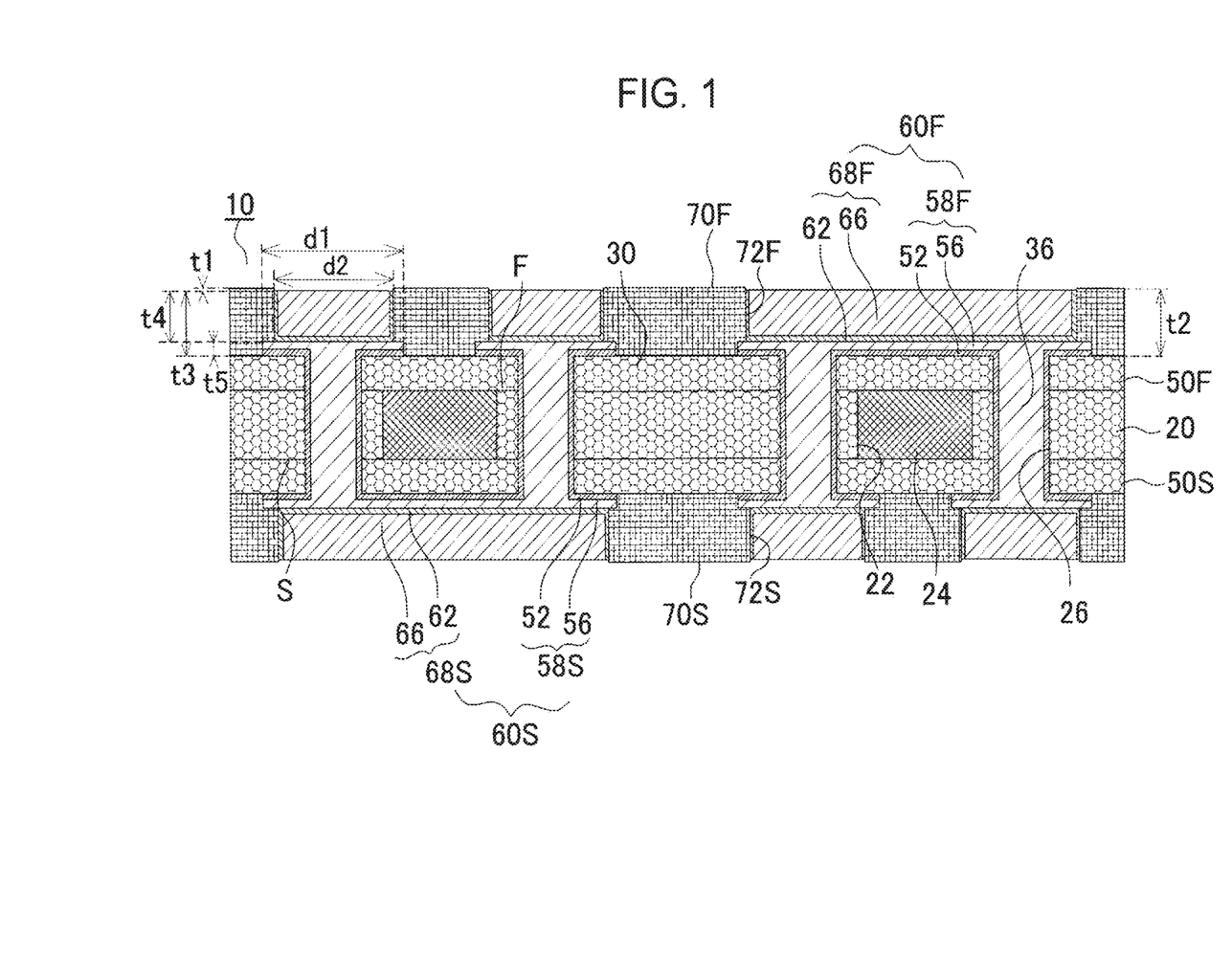
FIG. 1 is a cross-sectional view illustrating an inductor component according to a first embodiment of the present invention.

FIG. 1 is a cross-sectional view of an inductor component according to a first embodiment.

An inductor component 10 includes: a core base material 20 in which a magnetic body 24 containing a magnetic material is accommodated in an opening 22; a first resin insulating layer (50F) formed on a first surface (F) side of the core base material; a second resin insulating layer (50S) formed on a second surface (S) side of the core base material; a first conductor pattern (60F) formed on the first resin insulating layer (50F); a second conductor pattern (60S) formed on the second resin insulating layer (50S); through-hole conductors 36 that connect the first conductor pattern (60F) and the second conductor pattern (60S); a first coverlay (70F) formed on the first resin insulating layer (50F); and a second coverlay (70S) formed on the second resin insulating layer (50S). The first coverlay (70F) and the second coverlay (70S) are each, for example, a coating insulating layer formed of a polyimide film. The first conductor pattern (60F) and the second conductor pattern (60S) are formed from lower layer patterns (58F, 58S) and filling patterns (68F, 68S), the lower layer patterns (58F, 58S) being formed from first electroless copper plating films 52 and first electrolytic copper plating films 56 formed on the first resin insulating layer (50F) and the second resin insulating layer (50S), and the filling patterns (68F, 68S) being formed by filling trench grooves (72F, 72S) of the first coverlay (70F) and the second coverlay (70S) with plating. The filling pattern (68F) is formed by a second electroless copper plating film 62 and a second electrolytic copper plating film 66. The core base material preferably has a thickness of 0.1 mm-0.5 mm.

Figure 2A:
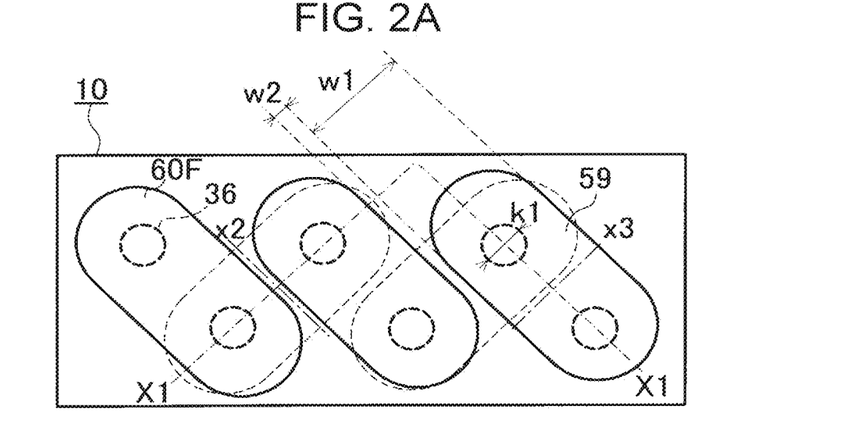
FIG. 2A is a plan view of an inductor structure of the first embodiment.
Figure 2B:
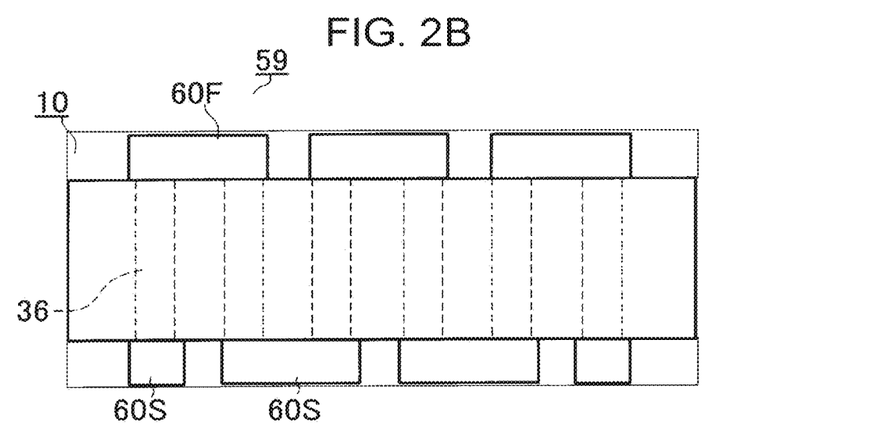
FIG. 2B is a side view of an inductor structure of the first embodiment.

FIG. 2A is a plan view of the inductor component 10. FIG. 2B is a side view of the inductor component 10. The first conductor pattern (60F) on the first surface side is connected to the second conductor pattern (60S) on the second surface side via the through-hole conductors 36. The first conductor pattern (60F) and the second conductor pattern (60S) are formed in a helical shape via the through-hole conductors 36, and an inductor 59 is formed by the first conductor pattern (60F), the second conductor pattern (60S) and the through-hole conductors 36.

FIG. 1 corresponds to an X1-X1 cross section of FIG. 2A. As illustrated in FIG. 1, in the inductor component 10, the resin insulating layer (50F) is formed on the first surface (F) of the core base material 20 and the first conductor pattern (60F) is formed on the resin insulating layer (50F). The resin insulating layer (50S) is formed on the second surface (S) side of the core base material 20, and the second conductor pattern (60S) is formed on the resin insulating layer (50S). The through-hole conductors 36 that connect the first conductor pattern (60F) and the second conductor pattern (60S) to each other are respectively formed in through holes 26 that are formed in the core base material 20.

In the inductor component of the first embodiment, the first conductor pattern (60F) and the second conductor pattern (60S) on the front and back sides of the core base material 20 are formed in a helical shape via the through-hole conductors 36 in the core base material, and an inductor is formed. Magnetic flux concentrates in a space surrounded by the first conductor pattern (60F) and the second conductor pattern (60S) that are formed in a helical shape. The magnetic material (magnetic body) 24 exists in the place where the magnetic flux concentrates, and a density of the magnetic flux increases, and desired inductance characteristics (inductance value and Q value) can be obtained.

In the inductor component of the first embodiment, the lower layer patterns (conductor patterns) (58F, 58S) are respectively provided on the resin insulating layers (50F, 50S) on the core base material 20. In this case, a conductor pattern is provided on a resin insulating layer. Therefore, as compared to a case where a conductor pattern and a magnetic body are in contact with each other, adhesion of the conductor pattern can be easily ensured.

In the inductor component of the first embodiment, the magnetic body 24 and the through-hole conductors 36 are respectively formed in the opening and the through holes that are formed in the core base material. As a result, contact between the magnetic body 24 and the through-hole conductors 36 is avoided. As a result, adhesion of the through-hole conductors can be easily ensured.

The first conductor pattern (60F) and the second conductor pattern (60S) are formed from the lower layer patterns (58F, 58S) and the filling patterns (68F, 68S), the lower layer patterns (58F, 58S) being formed on the first resin insulating layer (50F) and the second resin insulating layer (50S), and the filling patterns (68F, 68S) being formed by filling the trench grooves (72F, 72S) of the first coverlay (70F) and the second coverlay (70S) with plating. A thickness (t2) of each of the first coverlay (70F) and the second coverlay (70S) is 105 µm, and a thickness (t3) of each of the first conductor pattern (60F) and the second conductor pattern (60S) is, for example, 100 µm. The first conductor pattern (60F) and the second conductor pattern (60S) respectively have the filling patterns (68F, 68S) that are respectively formed by filling the trench grooves (72F, 72S) of the first coverlay (70F) and the second coverlay (70S) with plating and thus can each have a large thickness. It is desirable that a conductor thickness of each of the first conductor pattern and the second conductor pattern be 50 µm or more and 200 µm or less. Since the conductor thickness of each of the first conductor pattern and the second conductor pattern is as thick as 50 µm or more, a DC resistance is low. The through-hole conductors 36 each have a diameter (k1) (see FIG. 2A) of 0.15 mm and a cross-sectional area of 0.0169 mm2. On the other hand, the lower layer patterns (58F, 58S) that respectively form the first conductor pattern and the second conductor pattern each have a width (d1) of 250 µm, a thickness (t5) of 15 µm and a cross-sectional area of 0.00375 mm2. The filling patterns (68F, 68S) each have a width (d2) of 230 µm, a thickness (t4) of 85 µm and a cross-sectional area of 0.0196 mm2. The first conductor pattern and the second conductor pattern that are formed from the lower layer patterns and the filling patterns each have a cross-sectional area 0.0234 mm2. The cross-sectional area of each of the first conductor pattern and the second conductor pattern is 1.38 times that of each of the through-hole conductors. A preferred range of the cross-sectional area of each of the first conductor pattern and the second conductor pattern is 0.8-2 times and around 1 times that of each of the through-hole conductors. Therefore, the DC resistance of the inductor 59 as a whole is low and R in Q=ω L/R can be reduced, and thus a high Q value (desired inductance characteristic) can be obtained. Here, when the through-hole conductors each have a tapered shape, the cross-sectional area of each of the through-hole conductors is a cross-sectional area of a portion having a smallest diameter.

As described above, the conductor thickness (t3) of each of the first conductor pattern and the second conductor pattern is 100 µm. It is desirable that the conductor thickness of each of the first conductor pattern and the second conductor pattern be 50 µm or more and 200 µm or less. On the other hand, here, an interline insulation distance (w2) of the first conductor pattern and the second conductor pattern illustrated in FIG. 2A is 25 µm. That is, (the conductor thickness of each of the first conductor pattern and the second conductor pattern)/(the interline insulation distance of the first conductor pattern and the second conductor pattern) is 4. A preferred range is 2-8. In the first embodiment, the first conductor pattern (60F) and the second conductor pattern (60S) respectively have the filling patterns (68F, 68S) that are respectively formed by filling the trench grooves (72F, 72S) of the first coverlay (70F) and the second coverlay (70S) with plating and thus can each have a large thickness. On the other hand, since the interline insulation distance is formed by the first coverlay (70F) and the second coverlay (70S) remaining between the trench grooves (72F, 72S), even when the thickness of each of the first conductor pattern and the second conductor pattern is large, reliability of interline insulation is not impaired. Further, since a potential difference between the first conductor pattern and the second conductor pattern forming the inductance is small, a high insulation breakdown voltage is not required. Therefore, a DC resistance value of the inductor component can be reduced without increasing a size of the inductor component. The first conductor pattern and the second conductor pattern each have a width (w1) of, for example, 250 μm.

In the inductor component of the first embodiment, as illustrated in FIG. 1, surfaces of the first conductor pattern (60F) and the second conductor pattern (60S) are respectively recessed by an amount of t1 (5 μm) from surfaces of outermost resin layers (the first coverlay (70F) and the second coverlay (70S)). Therefore, insulation reliability of the first conductor pattern (60F) and the second conductor pattern (60S) is high. Since surface unevenness is small, the inductor component of the first embodiment is suitable for being embedded in a printed wiring board.

In the inductor component of the first embodiment, as illustrated in FIG. 1, the conductor width (d2) of each of the filling patterns (68F, 68S) is smaller than the conductor width (d1) of each of the lower layer patterns (58F, 58S) that respectively form the first conductor pattern (60F) and the second conductor pattern (60S). The filling patterns (68F, 68S) are formed of plating one the lower layer patterns (58F, 58S). Therefore, by making the conductor width of each of the filling patterns (68F, 68S) smaller, reliability of connection to the lower layer patterns (58F, 58S) of the filling patterns (68F, 68S) is high.

Figure 7:
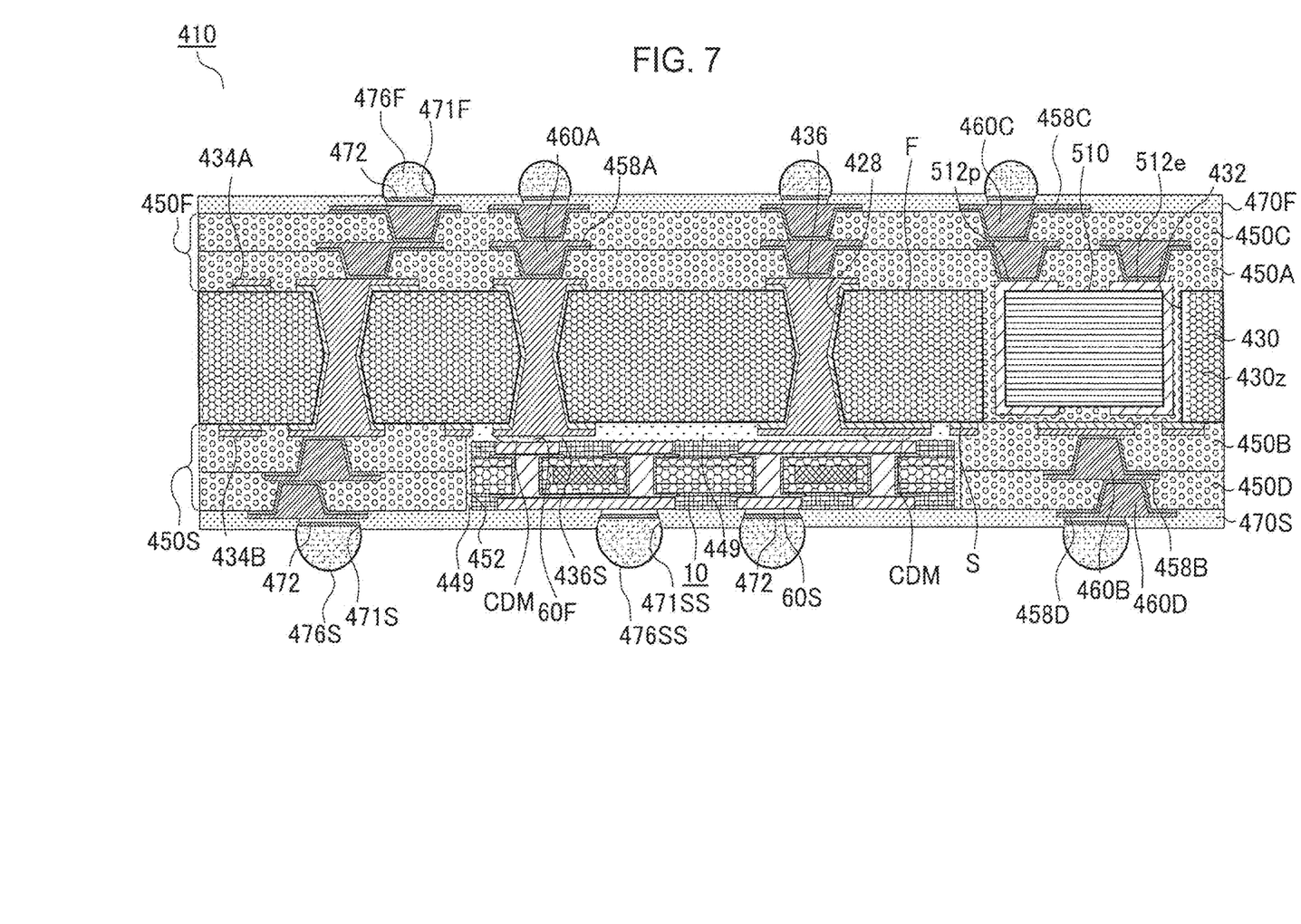
FIG. 7 is a cross-sectional view of a printed wiring board that includes the inductor component according to the first embodiment.

FIG. 7 illustrates a cross-sectional view of a printed wiring board 410 that includes the inductor component of the first embodiment. The printed wiring board 410 has a core substrate 430 that is formed by: an insulating base material (430z) that has a first surface (F) and a second surface (S) that is on an opposite side of the first surface (F); a first conductor layer (434A) on the first surface (F) of the insulating base material; a second conductor layer (434B) on the second surface (S) of the insulating base material; and through-hole conductors 436 that connect the first conductor layer (434A) and the second conductor layer (434B) to each other. The core substrate has a first surface (F) and a second surface (S) that is on an opposite side of the first surface (F). The first surface of the core substrate and the first surface of the insulating base material are the same surface; and the second surface of the core substrate and the second surface of the insulating base material are the same surface.

The through-hole conductors 436 are formed by filling through holes 428 formed in the insulating base material (430z) with a plating film. Further, in the insulating base material (430z), a through hole 432 is formed, in which a multilayer ceramic capacitor 510 is accommodated. The multilayer ceramic capacitor 510 has electrodes (512p, 512e).

The printed wiring board 410 further has an upper side build-up layer (450F) on the first surface (F) of the core substrate 430. The upper side build-up layer (450F) includes an insulating layer (450A) that is formed on the first surface (F) of the core substrate 430, a conductor layer (458A) on the insulating layer (450A), and via conductors (460A) that penetrate the insulating layer (450A) and connect the first conductor layer (434A), the through-hole conductors 436, and the electrodes (512p, 512e) of the multilayer ceramic capacitor 510 to the conductor layer (458A). The upper side build-up layer (450F) further includes an insulating layer (450C) on the insulating layer (450A) and the conductor layer (458A), a conductor layer (458C) on the insulating layer (450C), and via conductors (460C) that penetrate the insulating layer (450C) and connect the conductor layer (458A) and the via conductors (460A) to the conductor layer (458C).

The printed wiring board 410 further has a lower side build-up layer (450S) on the second surface (S) of the core substrate 430. The lower side build-up layer (450S) include an insulating layer (450B) that is formed on the second surface (S) of the core substrate 430, a conductor layer (458B) on the insulating layer (450B), and via conductors (460B) that penetrate the insulating layer (450B) and connect the second conductor layer (434B) and the through-hole conductors 436 to the conductor layer (458B). The lower side build-up layer (450S) further includes an insulating layer (450D) on the insulating layer (450B) and the conductor layer (458B), a conductor layer (458D) on the insulating layer (450D), and via conductors (460D) that penetrate the insulating layer (450D) and connect the conductor layer (458B) and the via conductors (460B) to the conductor layer (458D).

The lower side build-up layer (450S) of the printed wiring board 410 includes the inductor component 10. In the first embodiment, the lower side build-up layer of the printed wiring board 410 has a cavity 452 for accommodating the inductor component 10. Then, the printed wiring board 410 of the first embodiment has the inductor component 10 accommodated in the cavity 452. In the first embodiment, the cavity 452 penetrates the lower side build-up layer. Due to the cavity, the second surface of the core substrate and lower surfaces (lower side through hole lands) (436S) of the through-hole conductors are exposed. The cavity 452 is fondled in the lower side and lowermost insulating layers (450B, 450D).

The first conductor pattern (60F) of the inductor component 10 and the lands (lower side through hole lands) (436S) of the through-hole conductors 436 can be electrically connected to each other by conductive members (joining members) (CDM). The joining members are each, for example, a solder, a conductive paste, or an anisotropic conductive film. Each inductor 59 of the inductor component 10 is formed in a helical shape so as to loop along axes (x2, x3) in directions parallel to the front and back surfaces of the core substrate 430 (see FIG. 2A).

A gap between a side wall of the lower side build-up layer exposed by the cavity 452 and the inductor component 10 may be filled with a filling resin 449. A gap between the second surface of the core substrate 430 or the through-hole conductors and the inductor component may also be filled with the filling resin 449. The filling resin 449 may contain magnetic particles. A Q value or an inductance value of the inductor is unlikely to decrease. Examples of the magnetic particles include iron oxide (III), cobalt iron oxide, and the like.

The printed wiring board of the first embodiment further has a solder resist layer (470F) having openings (471F) on the upper side build-up layer (450F) and a solder resist layer (470S) having openings (471S, 471SS) on the lower side build-up layer (450S) and the inductor component 10. The second surface side of the inductor component 10 is covered by the solder resist layer (470S) on the lower side build-up layer. Therefore, the inductor component does not have to have a solder resist layer on the second surface side.

Portions of upper surfaces of the conductor layers (458C, 458D) and the via conductors (460C, 460D) exposed by the openings (471F, 471S) of the solder resist layers (470F, 470S) function as pads. A protective film 472 composed of Ni/Au, Ni/Pd/Au, Pd/Au, or OSP is formed on each of the pads. Solder bumps (476F, 476S) are formed on the protective films. An IC chip (not illustrated in the drawings) is mounted on the printed wiring board 410 via the solder bumps (476F) that are formed on the upper side build-up layer (450F). The printed wiring board 410 is mounted on a motherboard via the solder bumps (476S) that are formed on the lower side build-up layer (450S).

The solder resist layer (470S) further has the openings (471SS) that expose the second conductor pattern (60S) of the inductor component. A protective film 472 can be formed on the second conductor layer. Connecting members (476SS) such as solder bumps are formed on the second conductor pattern (60S). Examples of connecting members other than solder bumps include conductive paste and anisotropic conductive rubber.

In the first embodiment, the inductor 59 has a helical shape formed by looping along an axis parallel to a plane of the core substrate 430 and loops in a lateral direction, not in a thickness direction of the printed wiring board. Therefore, the number of turns can be increased without increasing a thickness of the printed wiring board, and desired inductance characteristics (inductance value and Q value) can be obtained. Further, since the inductor component 10 is positioned on the second surface side of the printed wiring board, the inductor component may be positioned directly below a semiconductor mounted on the first surface of the printed wiring board, and a wiring length between the semiconductor and the inductor component can be shortened, and power transmission to the semiconductor can be performed at a high speed with high efficiency.

Method for Manufacturing Inductor Component of First Embodiment

A method for manufacturing the inductor component of the first embodiment is illustrated in FIG. 3A-6D.

Figure 3A:
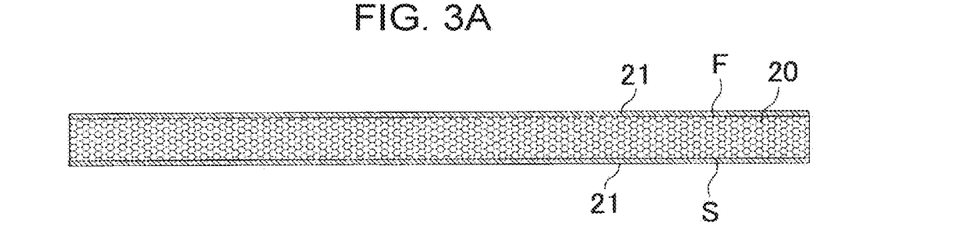
FIG. 3A-3E are process diagrams illustrating a method for manufacturing the inductor component according to the first embodiment.
Figure 3B:
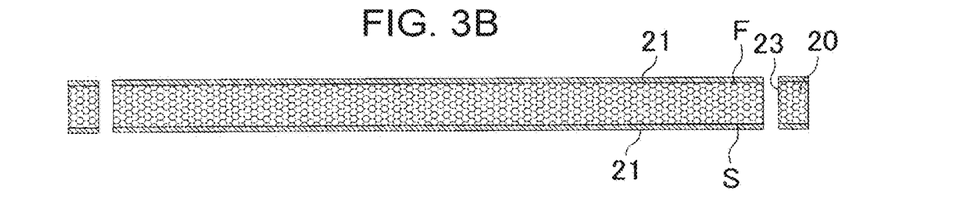
Figure 3C:
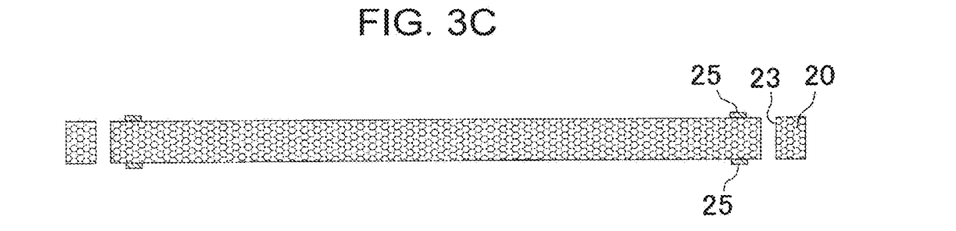
Figure 3D:
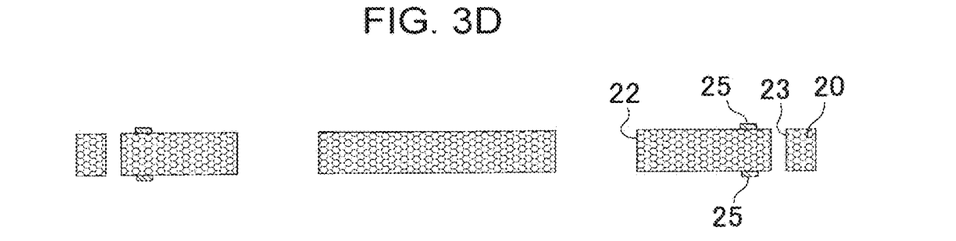
Figure 3E:
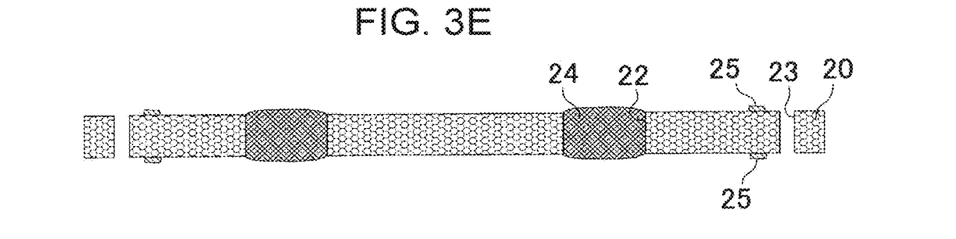
Figure 4A:
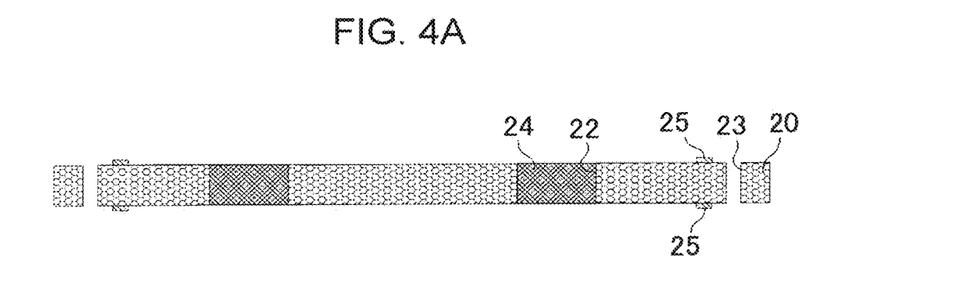
FIG. 4A-4D are process diagrams illustrating the method for manufacturing the inductor component according to the first embodiment.

The core base material 20 having a thickness of 0.15 mm is prepared. A copper foil 21 is laminated on the core base material 20 (FIG. 3A). Through holes 23 are formed at corners of the core base material 20 (FIG. 3B). The copper foil is patterned by etching and alignment marks 25 are formed (FIG. 3C). The opening 22 is formed by router processing (FIG. 3D). The magnetic body 24 inside the opening 22 is vacuum-printed using a metal mask (FIG. 3E). The magnetic body is a composite body formed of a magnetic metal and an organic material such as a resin. That the magnetic body has a magnetic permeability of 2-20 and a magnetic saturation of 0.1 T-2 T is desirable in that the desired inductance characteristics (inductance value and Q value) can be obtained. The surfaces of the core base material 20 are polished using a belt and unevenness of the substrate is smoothed to ±10 μm (FIG. 4A).

Figure 2C:
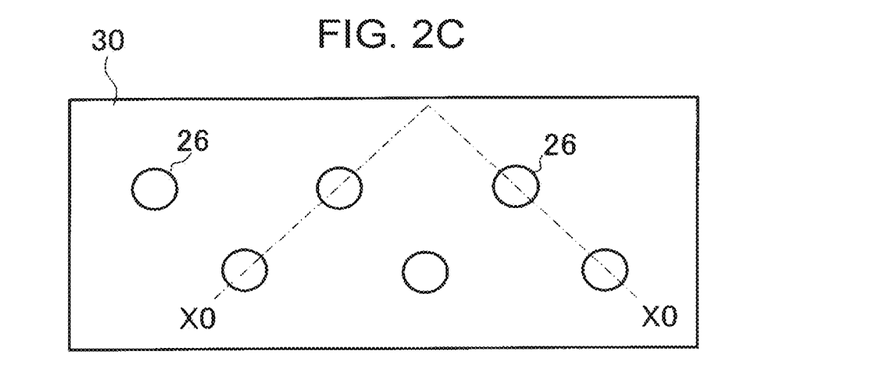
FIG. 2C is a plan view of an inductor structure of the first embodiment.
Figure 4B:
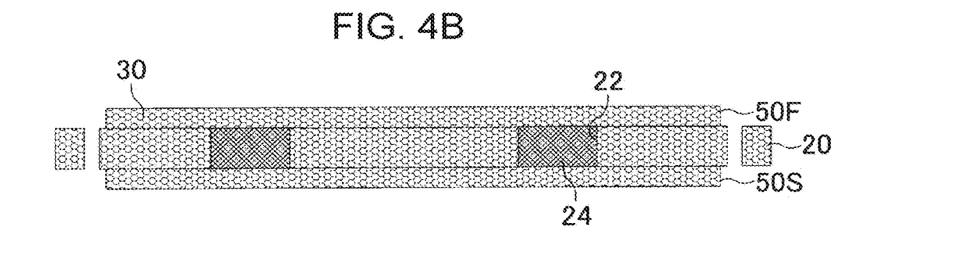
Figure 4C:
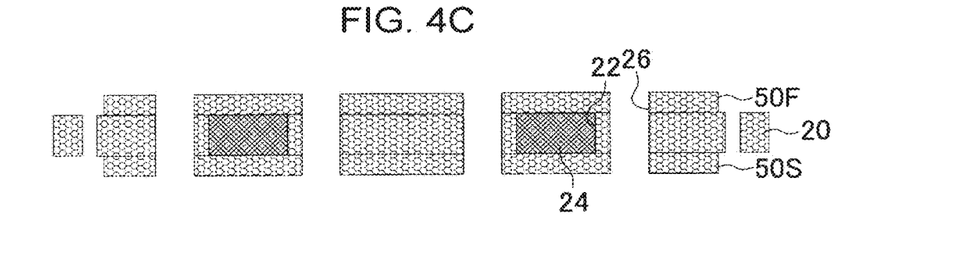

A prepreg having a thickness of 40 μm is laminated on the first surface (F) and the second surface (S) of the core base material 20, and the first resin insulating layer (50F) and the second resin insulating layer (50S) are formed, and a laminated body 30 is completed (FIG. 4B). The through holes 26 are formed at through hole formation sites of the laminated body 30 using a drill (FIG. 4C). A plan view of the laminated body 30 is illustrated in FIG. 2C. FIG. 4C corresponds to an X0-X0 cross section in FIG. 2C.

Figure 4D:
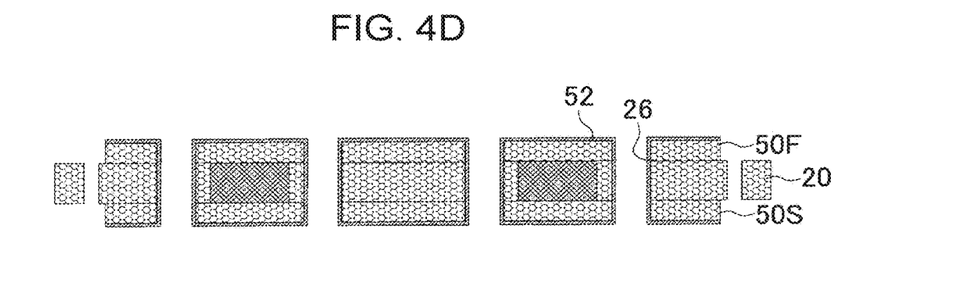
Figure 5A:
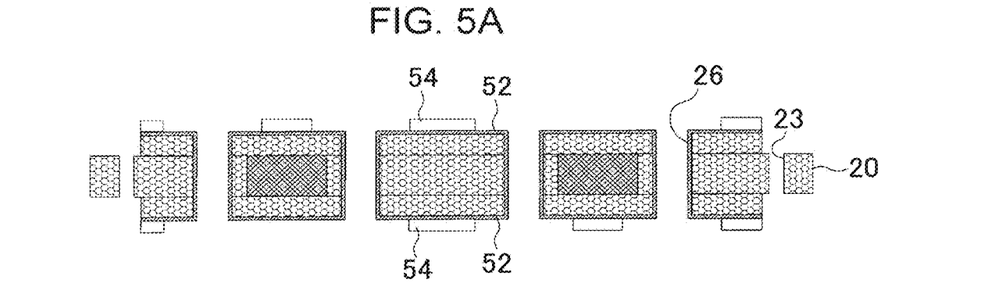
FIG. 5A-5D are process diagrams illustrating the method for manufacturing the inductor component according to the first embodiment.
Figure 5B:
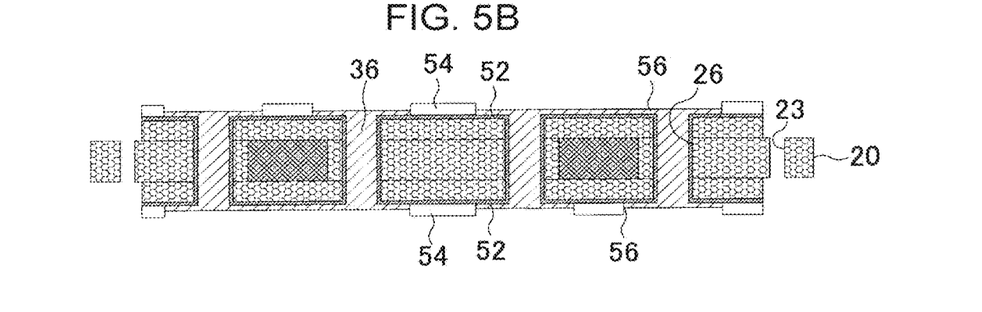
Figure 5C:
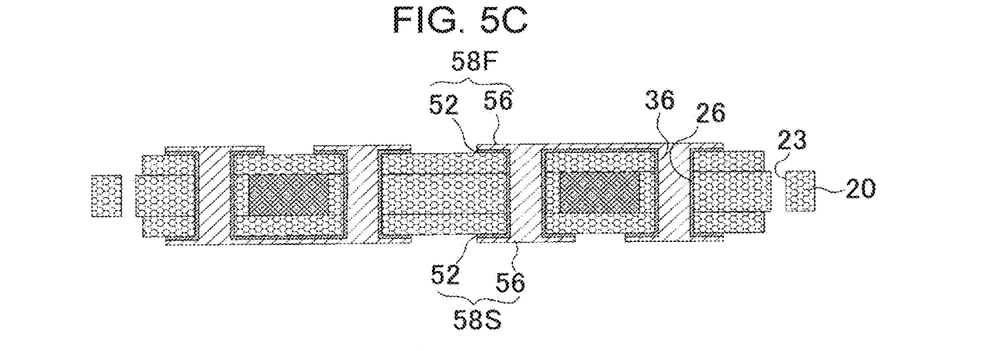

The first electroless copper plating film 52 is formed on the first resin insulating layer (50F) and the second resin insulating layer (50S) and on inner walls of the through holes 26 (FIG. 4D). A resist composition is formed on the first electroless copper plating film 52, and a plating resist 54 is formed by exposure and development (FIG. 5A). The through holes 26 are filled with electrolytic plating and the through-hole conductors 36 are formed. At the same time, the first electrolytic copper plating film 56 is formed in a non-forming portion of the plating resist 54 (FIG. 5B). The plating resist is removed. The first electroless copper plating film 52 in a non-forming portion of the first electrolytic copper plating film 56 is removed. The lower layer patterns (58F, 58S) are formed from the first electroless copper plating film 52 and the first electrolytic copper plating film 56 (FIG. 5C).

Figure 5D:
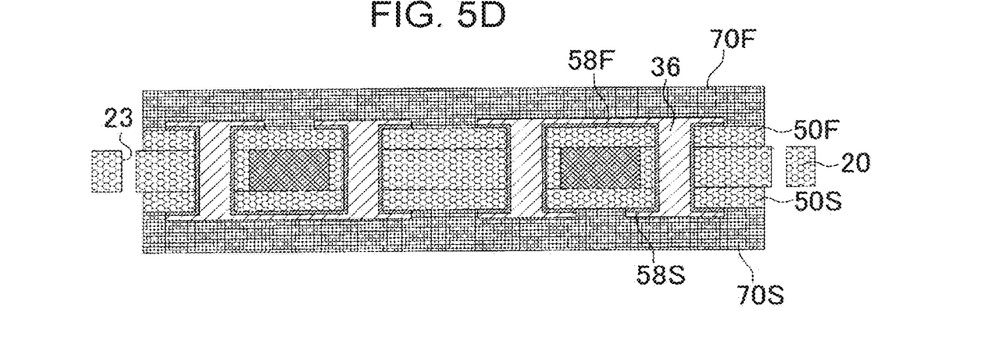
Figure 6A:
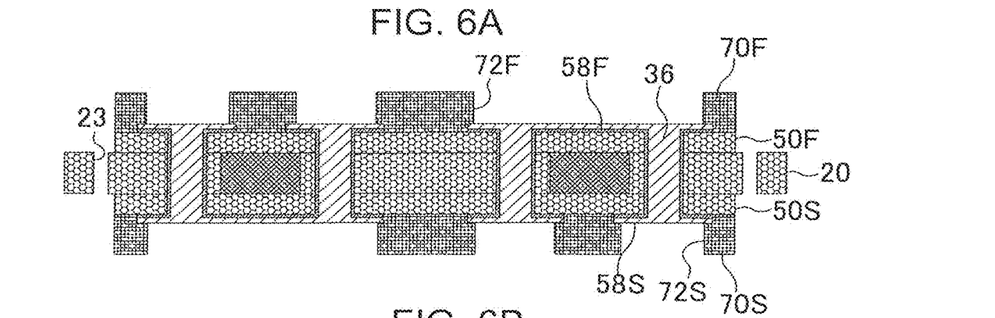
FIG. 6A-6D are process diagrams illustrating the method for manufacturing the inductor component according to the first embodiment.
Figure 6B:
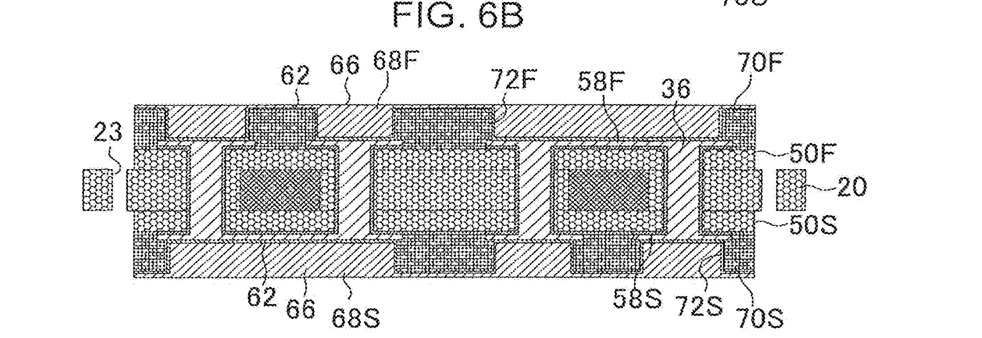
Figure 6C:
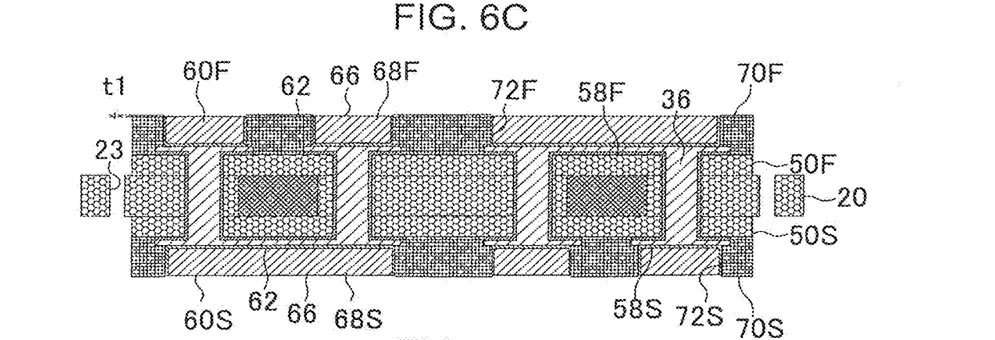
Figure 6D:
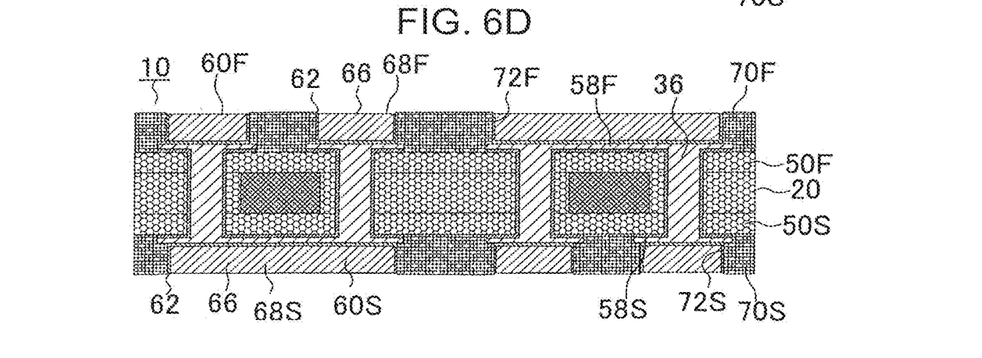

The coverlays (70F, 70S) composed of polyimide are respectively laminated on the first resin insulating layer (50F) and the lower layer pattern (58F) and on the second resin insulating layer (50S) and the lower layer pattern (58S) (FIG. 5D). The trench grooves (72F, 72S) that respectively expose the lower layer patterns (58F, 58S) are respectively formed in the coverlays (70F, 70S) using laser (FIG. 6A). The second electroless copper plating film 62 and the second electrolytic copper plating film 66 are formed in the trench grooves (72F, 72S) on the coverlays (70F, 70S) (FIG. 6B). The second electroless copper plating film 62 and the second electrolytic copper plating film 66 on the coverlays (70F, 70S) are removed by etching and the filling patterns (68F, 68S) are formed, and the first conductor pattern (60F) and the second conductor pattern (60S) are completed (FIG. 6C). During the etching, the surfaces of the first conductor pattern (60F) and the second conductor pattern (60S) are respectively recessed by an amount of t1 (5 μm) from the surfaces of the first coverlay (70F) and the second coverlay (70S). Then, cutting into individual pieces is performed, and the inductor component 10 is completed (FIG. 6D). Since the inductor component of the first embodiment can be manufactured using the same method for manufacturing a printed wiring board, the manufacture is easy.

First Modified Example of First Embodiment

Figure 8:
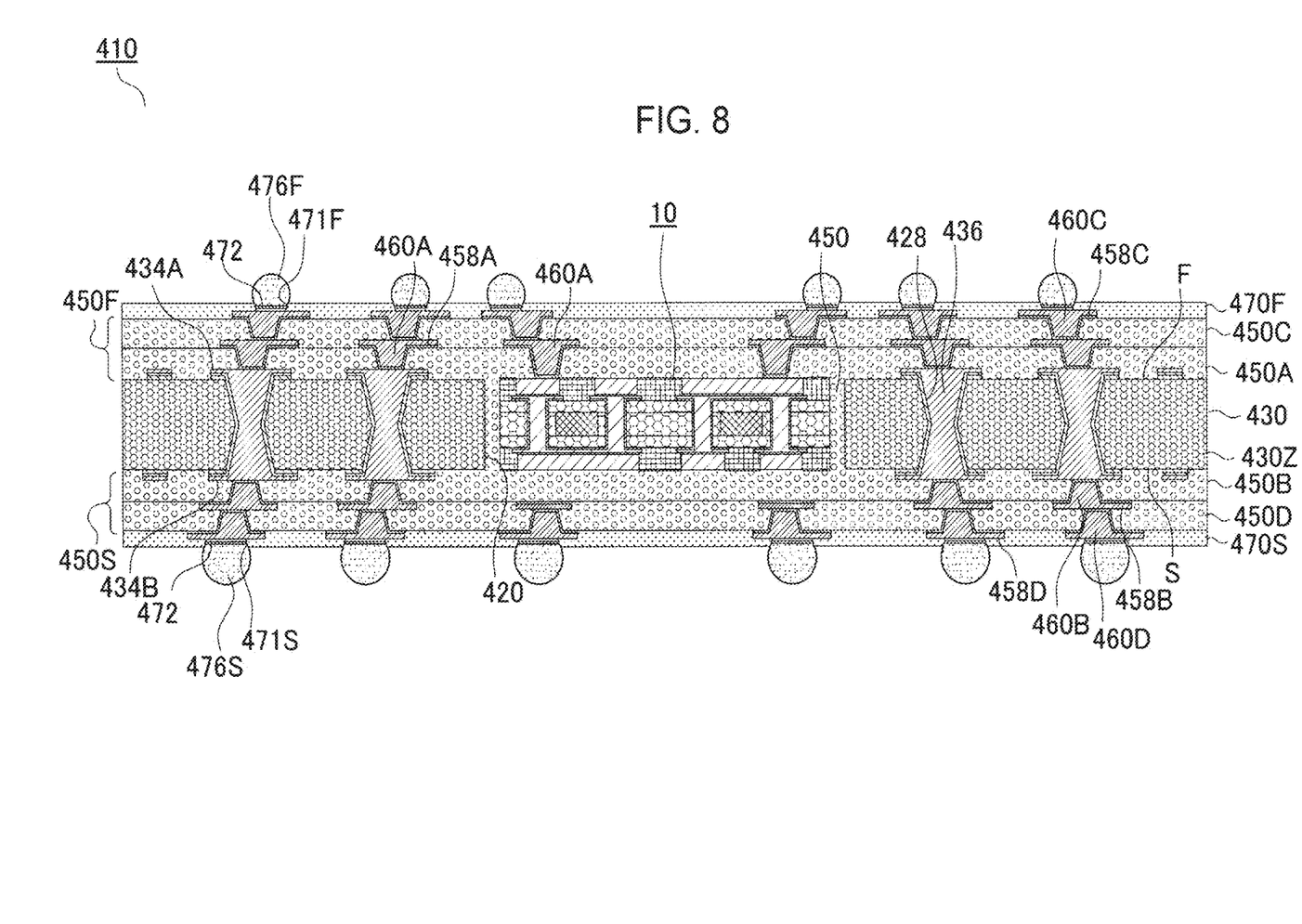
FIG. 8 is a cross-sectional view of a printed wiring board that includes an inductor component according to a first modified embodiment of the first embodiment.

A cross section of a printed wiring board 410 that forms a printed wiring board according to a first modified embodiment of the first embodiment is illustrated in FIG. 8. The printed wiring board 410 of the first modified embodiment of the first embodiment has an opening 420 in the core substrate 430 for accommodating the inductor component 10. In the printed wiring board of the first modified embodiment of the first embodiment, a thick inductor component can be accommodated.

Japanese Patent Laid-Open Publication No. 2008-270532 describes an inductor component manufactured by press working. This inductor component is bonded onto a substrate. Thereafter, a build-up layer is formed on the substrate and the inductor component.

Since the inductor component in Japanese Patent Laid-Open Publication No. 2008-270532 is formed from a metal plate, it is likely to be difficult to connect inductors of different layers and to increase an inductance value.

An inductor component according to an embodiment of the present invention allows desired inductance characteristics (inductance value and Q value) to be obtained, and another embodiment of the present invention relates to a method for manufacturing such an inductor component.

An inductor component according to an embodiment of the present invention includes: a core base material that has a primary surface and a secondary surface that is on an opposite side of the primary surface and has through holes; a first conductor pattern that is formed on the primary surface of the core base material; a second conductor pattern that is formed on the secondary surface of the core base material; through-hole conductors that are respectively provided in the through holes and connect the first conductor pattern and the second conductor pattern to each other; an inductor that is formed from the first conductor pattern, the second conductor pattern and the through-hole conductors; and a magnetic body that is formed of a magnetic material provided on an inner side of the inductor. The first conductor pattern and the second conductor pattern each have a conductor thickness of 50 μm or more and 200 μm or less, and (cross-sectional area of each of the first conductor pattern and the second conductor pattern)/(cross-sectional area of each of the through-hole conductors) is 0.8-2.0.

In an embodiment the present invention, the inductor has a helical shape formed along an axis parallel to a plane of the core substrate and loops in a lateral direction, not in a thickness direction of a printed wiring board. Therefore, the number of turns can be increased without increasing a thickness of the printed wiring board, and desired inductance characteristics (inductance value and Q value) can be obtained. Further, the conductor thickness of each of the first conductor pattern and the second conductor pattern is as thick as 50 μm or more, a DC resistance is low. Further, since (the cross-sectional area of each of the first conductor pattern and the second conductor pattern)/(the cross-sectional area of each of the through-hole conductors) is 0.8-2.0 and larger than about 1, the DC resistance of the inductor as a whole is low and a desired Q value can be obtained.

Obviously, numerous modifications and variations of the present invention are possible in light of the above teachings. It is therefore to be understood that within the scope of the appended claims, the invention may be practiced otherwise than as specifically described herein.

The invention claimed is:

1. An inductor component, comprising:
   a laminated body comprising a core base material;
   a first coverlay formed on a first surface of the laminated body;
   a second coverlay formed on a second surface of the laminated body on an opposite side with respect to the first surface of the laminated body;
   a magnetic body accommodated in the core base material of the laminated body;
   a first conductor pattern formed on the first surface of the laminated body and comprising a filling pattern filling a trench groove pattern formed in the first coverlay;
   a second conductor pattern formed on the second surface of the laminated body and comprising a filling pattern filling a trench groove pattern formed in the second coverlay; and
   a plurality of through-hole conductors formed in a plurality of through holes formed through the laminated body respectively such that the plurality of through-hole conductors is connecting the first conductor pattern and the second conductor pattern,
   wherein the first conductor pattern, the second conductor pattern and the through-hole conductors are positioned to form an inductor such that the magnetic body comprising a magnetic material is positioned on an inner side of the inductor, the plurality of through-hole conductors is formed such that each through-hole conductor has a diameter k1, the first and second conductor patterns are formed such that at least one of the first and second conductor patterns has a conductor thickness in a range of 50 μm to 200 μm and has a plurality of line patterns each having a width w1 and separated by a line separation distance w2, and the plurality of line patterns is formed such that a ratio of a cross-sectional area of each line pattern to a cross-sectional area of each through-hole conductor along the diameter k1 in a direction of the width w1 is in a range of 0.8 to 2.0.

2. An inductor component according to claim 1, wherein the first conductor pattern is formed such that a surface of the first conductor pattern is recessed from a surface of the first coverlay, and the second conductor pattern is formed such that a surface of the second conductor pattern is recessed from a surface of the second coverlay.

3. An inductor component according to claim 1, wherein each of the first and second conductor patterns comprises a first electrolytic copper plating film and the filling pattern formed on the first electrolytic copper plating film and comprising an electroless copper plating film and a second electrolytic copper plating film such that the filling pattern has a width d2 which is narrower than a width d1 of the first electrolytic copper plating film.

4. An inductor component according to claim 1, wherein each of the first and second conductor patterns is formed such that a ratio of a conductor thickness of each of the first and second conductor patterns to the line separation distance w2 is in a range of 2 to 8.

5. An inductor component according to claim 1, wherein the first conductor pattern, the second conductor pattern and the through-hole conductors are positioned to form the inductor such that the inductor has a helical shape having an axis extending in a direction parallel to the first and second surfaces of the laminated body.

6. An inductor component according to claim 1, wherein the magnetic body comprises a magnetic metal material and an organic material.

7. An inductor component according to claim 1, wherein the laminated body includes a plurality of resin insulating layers formed on primary and secondary surfaces of the core base material respectively, the core base material has a penetrating opening in which the magnetic body is accommodated, and the plurality of resin insulating layers is covering the magnetic body in the penetrating opening of the core base material.

8. An inductor component according to claim 1, wherein the core base material has a thickness in a range of 0.1 mm to 0.5 mm.

9. An inductor component according to claim 2, wherein each of the first and second conductor patterns is formed such that a ratio of a conductor thickness of each of the first and second conductor patterns to the line separation distance w2 is in a range of 2 to 8.

10. An inductor component according to claim 2, wherein the first conductor pattern, the second conductor pattern and the through-hole conductors are positioned to form the inductor such that the inductor has a helical shape having an axis extending in a direction parallel to the first and second surfaces of the laminate body.

11. An inductor component according to claim 2, wherein the magnetic body comprises a magnetic metal material and an organic material.

12. An inductor component according to claim 2, wherein the laminated body includes a plurality of resin insulating layers formed on primary and secondary surfaces of the core base material respectively, the core base material has a penetrating opening in which the magnetic body is accommodated, and the plurality of resin insulating layers is covering the magnetic body in the penetrating opening of the core base material.

13. An inductor component according to claim 2, wherein the core base material has a thickness in a range of 0.1 mm to 0.5 mm.

14. An inductor component according to claim 2, wherein each of the first and second conductor patterns comprises a first electrolytic copper plating film and the filling pattern formed on the first electrolytic copper plating film and comprising an electroless copper plating film and a second electrolytic copper plating film such that the filling pattern has a width d2 which is narrower than a width d1 of the first electrolytic copper plating film.

15. An inductor component according to claim 3, wherein each of the first and second conductor patterns is formed such that a ratio of a conductor thickness of each of the first and second conductor patterns to the line separation distance w2 is in a range of 2 to 8.

16. An inductor component according to claim 3, wherein the first conductor pattern, the second conductor pattern and the through-hole conductors are positioned to form the inductor such that the inductor has a helical shape having an axis extending in a direction parallel to the first and second surfaces of the laminated body.

17. An inductor component according to claim 3, wherein the magnetic body comprises a magnetic metal material and an organic material.

18. An inductor component according to claim 3, wherein the laminated body includes a plurality of resin insulating layers formed on primary and secondary surfaces of the core base material respectively, the core base material has a penetrating opening in which the magnetic body is accommodated, and the plurality of resin insulating layers is covering the magnetic body in the penetrating opening of the core base material.

19. A method for manufacturing an inductor component, comprising:
  forming a penetrating opening through a core base material;
  forming a magnetic body in the penetrating opening of the core base material;
  forming a plurality of resin insulating layers on a primary surface and a secondary surface of the core base material respectively such that the plurality of resin insulating layers covers the magnetic body in the penetrating opening of the core base material;
  forming a plurality of penetrating holes in a laminated body comprising the core base material and resin insulating layers such that the plurality of penetrating holes penetrates through the laminated body;
  forming a plurality of resist patterns on the plurality of resin insulating layers;
  applying electrolytic plating such that a plurality of through-hole conductors is formed in the penetrating holes of the core base material respectively and that a plurality of first electrolytic copper plating films is formed in a plurality of patterns formed by the resist patterns on the resin insulating layers respectively;
  removing the plurality of resist patterns from the plurality of resin insulating layers;
  forming a plurality of coverlays laminated on the resin insulating layers and first electrolytic copper plating films respectively such that the plurality of coverlays includes a first coverlay formed on a first surface of the laminated body and a second coverlay formed on a second surface of the laminated body on an opposite side with respect to the first surface of the laminated body;
  irradiating laser upon the coverlays such that a plurality of trench grooves is formed through the coverlays and that the plurality of trench grooves exposes the first electrolytic copper plating films respectively; and
  forming a plurality of second electrolytic copper films filling the plurality of trench grooves such that a first conductor pattern is formed on the first surface of the laminated body and comprises a filling pattern filling a trench groove pattern formed in the first coverlay, that a second conductor pattern is formed on the second surface of the laminated body and comprises a filling pattern filling a trench groove pattern formed in the second coverlay and that the plurality of through-hole conductors connects the first conductor pattern and the second conductor pattern,
  wherein the first conductor pattern, the second conductor pattern and the through-hole conductors are positioned to form an inductor such that the magnetic body comprising a magnetic material is positioned on an inner side of the inductor, the plurality of through-hole conductors is formed such that each through-hole conductor has a diameter k1, the first and second conductor patterns are formed such that at least one of the first and second conductor patterns has a conductor thickness in a range of 50 µm to 200 µm and has a plurality of line patterns each having a width w1 and separated by a line separation distance w2, and the plurality of line patterns is formed such that a ratio of a cross-sectional area of each line pattern to a cross-sectional area of each through-hole conductor along the diameter k1 in a direction of the width w1 is in a range of 0.8 to 2.0.

20. An inductor component according to claim 3, wherein the plurality of through-hole conductors includes the first electrolytic copper plating film, the first coverlay is formed such that the trench groove pattern of the first coverlay is formed to expose the first electrolytic copper plating film, and the second coverlay is formed such that the trench groove pattern of the second coverlay is formed to expose the first electrolytic copper plating film.

* * * * *